(12) United States Patent
Yue

(10) Patent No.: US 6,779,261 B2
(45) Date of Patent: Aug. 24, 2004

(54) INTEGRATED BALUN AND TRANSFORMER STRUCTURES

(75) Inventor: Chik Patrick Yue, Milpitas, CA (US)

(73) Assignee: Atheros Communications, Inc., Sunnyvale, CA (US)

( * ) Notice: Subject to any disclaimer, the term of this patent is extended or adjusted under 35 U.S.C. 154(b) by 0 days.

(21) Appl. No.: 10/346,403

(22) Filed: Jan. 15, 2003

(65) Prior Publication Data

US 2003/0151881 A1 Aug. 14, 2003

Related U.S. Application Data

(62) Division of application No. 10/012,209, filed on Nov. 5, 2001.

(51) Int. Cl.[7] .................................................. H05K 3/02
(52) U.S. Cl. ........................ 29/846; 29/602.1; 336/200; 336/223; 336/233
(58) Field of Search ................................. 336/200, 232, 336/223; 257/531; 29/602.1, 846

(56) References Cited

U.S. PATENT DOCUMENTS 5,610,433 A * 3/1997 Merrill et al. .............. 257/531

6,026,286 A  2/2000 Long ........................... 455/327

OTHER PUBLICATIONS

Mohan et al., "Modeling and characterization of on–chip transformers", Center for Integrated Systems, Stanford University, pp. 19.3.1–19.3.3 (undated).

Zolfaghari, et al. "Stacked inductors and transformers in CMOS technology", (IEEE J. of Solid–State Circuits, vol. 36, No. 4, Apr. 2001, pp. 620–628).

Simburger, et al. TP 13.6: a monolithic 3.7W silicon power amplifier with 59% PAE at 0.9 GHz (Feb. 1999, 4 pp).

* cited by examiner

Primary Examiner—Elvin Enad
Assistant Examiner—Jennifer A Poker
(74) Attorney, Agent, or Firm—Rosenberg, Klein & Lee

(57) ABSTRACT

A method for producing an on-chip signal transforming device. The method includes providing a substrate, and laying a first conductive layer above the substrate, wherein the first conductive layer has a plurality of interleaved inductors. The method then includes laying a second conductive layer above the substrate, wherein the second conductive layer has at least one inductor.

11 Claims, 5 Drawing Sheets

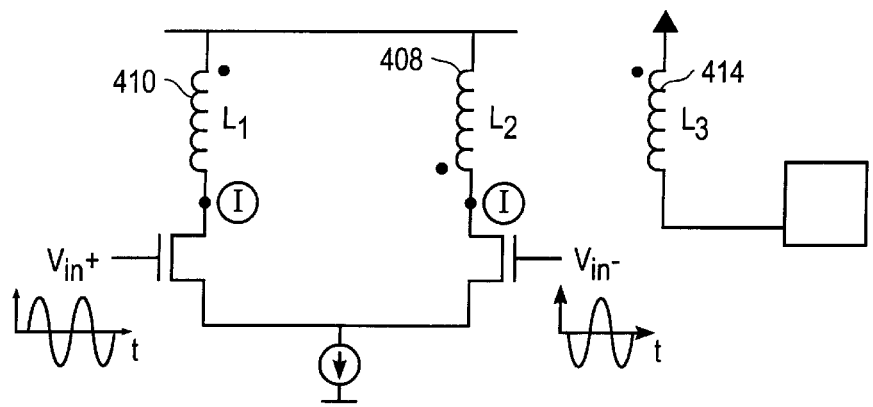
FIG. 4a
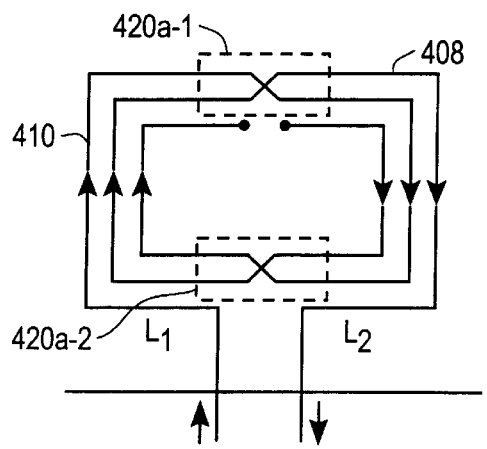
FIG. 4b1
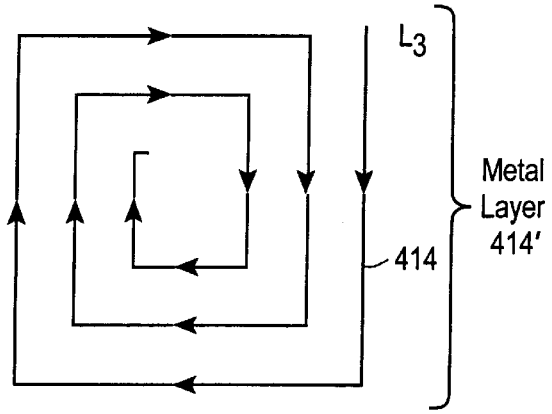
FIG. 4c
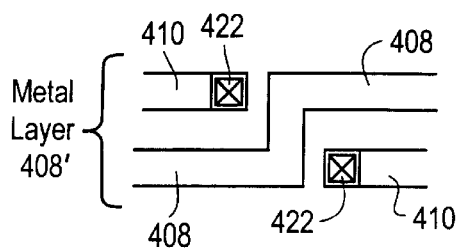
FIG. 4b2a
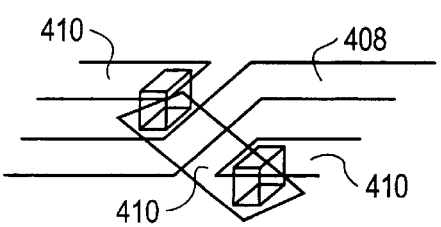
FIG. 4b3

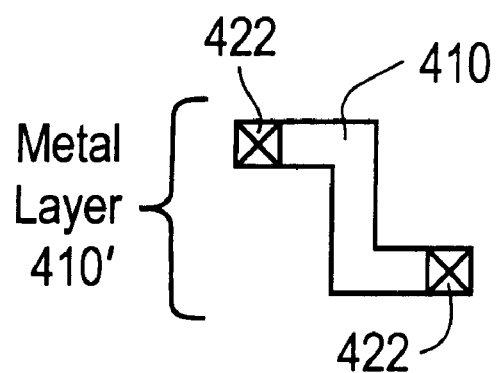
FIG. 4b2b

INTEGRATED BALUN AND TRANSFORMER STRUCTURES

This is a division of application Ser. No. 10/012,209, filed Nov. 5, 2001.

BACKGROUND OF THE INVENTION

1. Field of the Invention

The present invention relates generally to integrated circuit devices, and, more particularly, to baluns and transformers manufactured on integrated circuit chips.

2. Description of Related Art

Increasingly, due to reliability, performance and cost considerations, devices that previously resided on a printed circuit board (PCB) are being integrated into an integrated circuit (IC) chip. Transformers, inductors, and baluns are examples of devices that have migrated to the IC chip.

Due to the relatively noisy environment on an IC chip, many signals on a chip are typically differential or double-ended signals. Differential signals offer good common-mode rejection of noise; noise typically affects both halves of the differential signal in the same manner, and since information is contained in the difference of both signal halves, the difference does not change appreciably despite the noise that has been added to both halves.

A balun is an example of a device that accepts a single-ended signal and transforms it into a differential signal and vice versa. The term balun suggests its function: conversion of balanced (differential) signals to unbalanced (single-ended) signals. Signals on PCBs are typically single-ended signals. Since IC chips use differential signals, baluns have been placed on PCBs to transform a single-ended signal into a differential signal. Baluns have also been placed on IC chips. However, present designs suffer from asymmetrical parasitic characteristics (e.g., asymmetric parasitic capacitances and resistances) and poor magnetic coupling. The asymmetrical parasitic characteristics cause a differential signal to be asymmetrical. Symmetry in a differential signal is very important to the proper functioning of many differential circuits. Furthermore, poor magnetic coupling results in inefficient energy transfer.

A transformer is another example of a device that has on-chip uses. For example, a transformer can be used to match impedances between amplifier stages while providing DC isolation between the stages. A transformer for differential signals also needs to offer good magnetic coupling as well as symmetrical parasitic characteristics. Present designs do not offer relatively good parasitic characteristics and good magnetic coupling.

Thus, there is a need for baluns and transformers that provide improved symmetry and magnetic coupling.

SUMMARY OF THE INVENTION

A method for producing an on-chip signal transforming device is described. The method includes providing a substrate and laying a first conductive layer above the substrate, wherein the first conductive layer has a plurality of interleaved inductors. The method then includes laying a second conductive layer above the substrate, wherein the second conductive layer has at least one inductor.

BRIEF DESCRIPTION OF THE DRAWINGS

The present invention is illustrated by way of example, and not limitation, in the figures of the accompanying drawings in which like references denote similar elements, and in which:

FIG. 4a illustrates another balun according to one embodiment of the present invention, which has the capability to transform a differential signal to a single ended signal and vice-versa; and FIGS. 4b(1–3), and 4c illustrate three layers used to make the inductors of the balun illustrated in FIG. 4a.

DETAILED DESCRIPTION

Methods and apparatus for integrated transformers and baluns are described. In the following description, for purposes of explanation, numerous specific details are set forth in order to provide a thorough understanding of the present invention. However, one skilled in the art will appreciate that the present invention may be practiced in a variety of circuits, especially radio frequency circuits, without these specific details. In other instances, well-known operations, steps, functions and devices are not shown in order to avoid obscuring the invention. Repeated usage of the phrases "in one embodiment," "an alternative embodiment," or an "alternate embodiment" does not necessarily refer to the same embodiment, although it may.

Figure 1A:
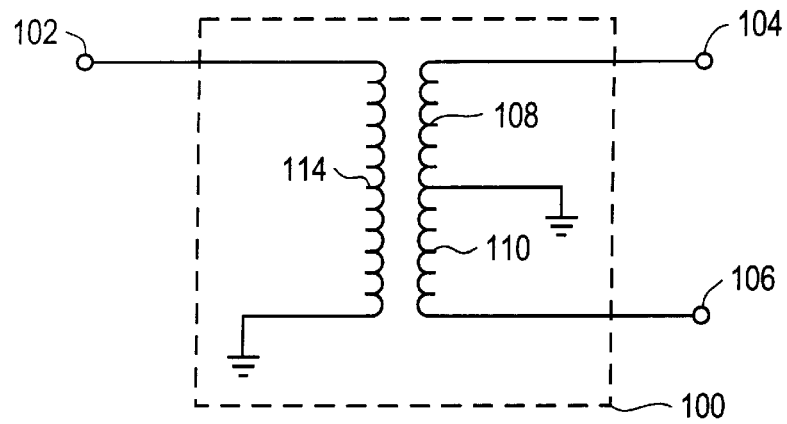
FIG. 1a illustrates an electrical circuit representation of a balun.

FIG. 1a illustrates an electrical circuit representation of a balun. Balun 100 includes inductors 114 and inductors 108 and 110. Inductors 108 and 110 are dc (direct current) decoupled from and magnetically coupled with inductor 114 permitting the transfer of energy. Balun 100 can convert the signal of unbalanced transmission line 102 into to a signal of balanced transmission lines 104 and 106. Balun 100 can also convert a signal of balanced transmission lines 104 and 106 to a signal of unbalanced transmission line 102. One advantage of the balanced portion is that external noise affects the lines of the balanced transmission equally without appreciably affecting the potential difference in lines 104 and 106. While the electric circuit representation for a balun has been known for a long time, the designs for integrated baluns and transformers of the present invention have heretofore been unkown.

Figure 1B:
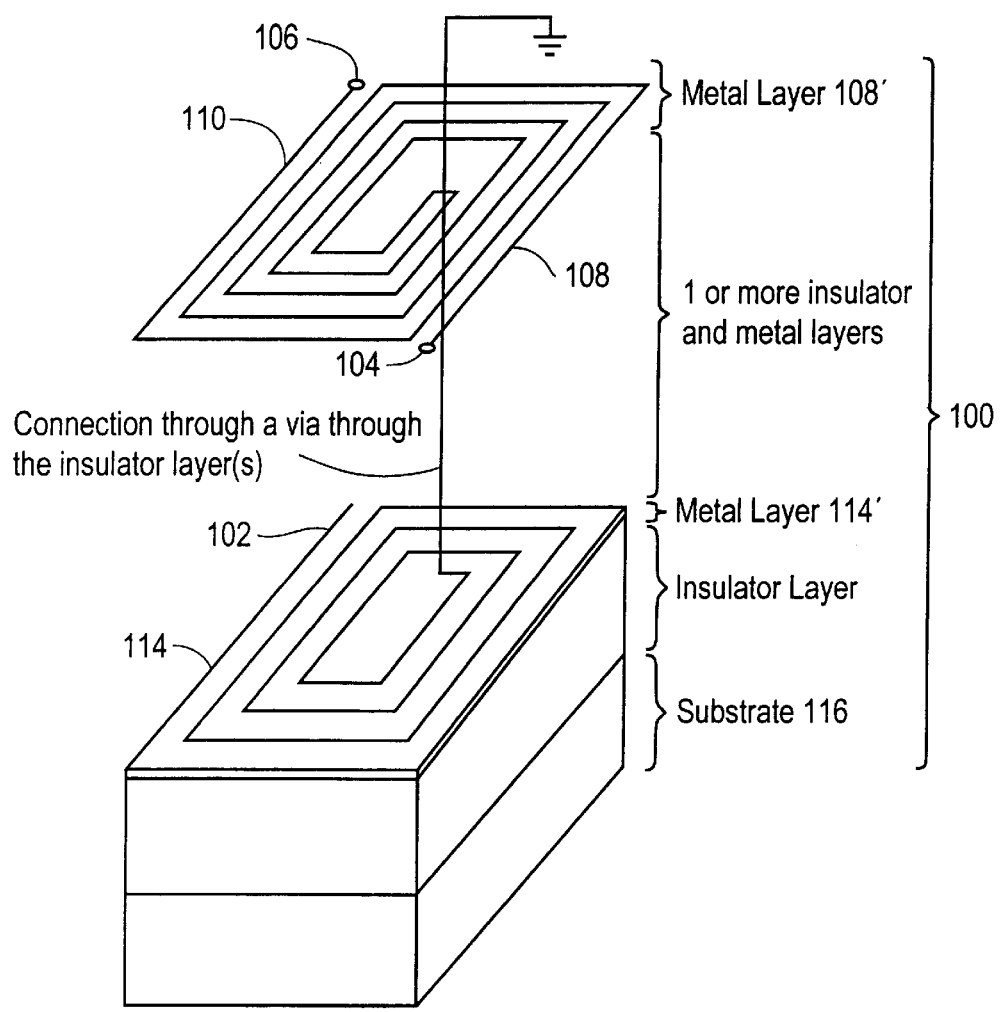
FIG. 1b illustrates a balun according to one embodiment of the present invention.

FIG. 1b illustrates a balun according to one embodiment of the present invention. Balun 100 includes two interleaved inductors 108 and 110 in metal layer 108' and vertically displaced spiral inductor 114 in metal layer 114', all of them above substrate 116. Making inductors 108 and 110 interleaved causes each of the inductors to have substantially equivalent parasitic characteristics; in other words they are symmetrical. Furthermore, having the interleaved inductors stacked above inductor 114 provides for relatively better magnetic coupling in comparison to a lateral coupling arrangement in which interleaved inductors of a primary winding are placed adjacent to and in the same layer as the inductor of a secondary winding.

While in the above description, balun 100 has interleaved inductors 108 and 110 above spiral inductor 114, in an alternative embodiment spiral inductor 114 is above interleaved inductors 108 and 110.

Figure 2:
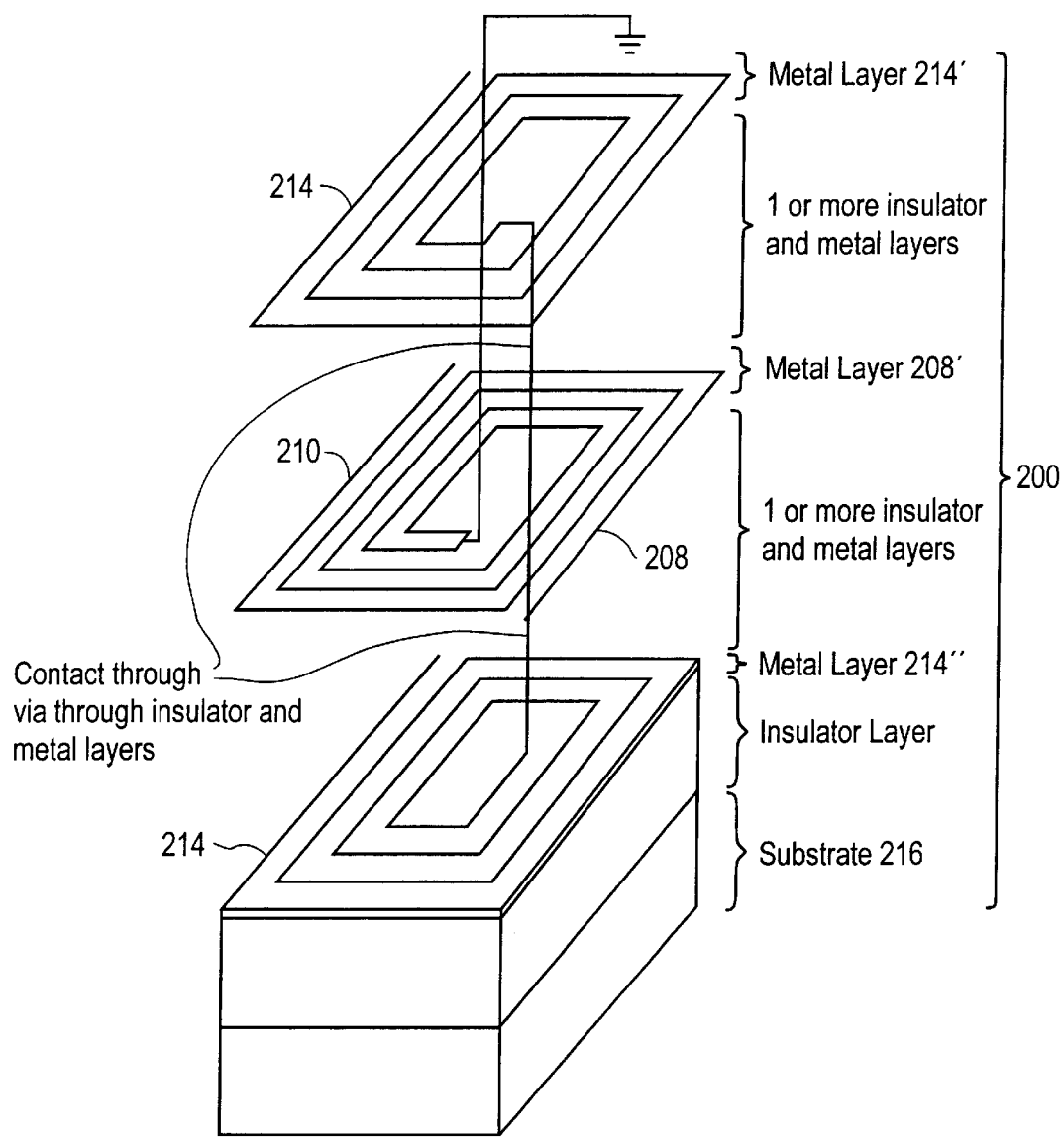
FIG. 2 illustrates a balun according to yet another embodiment of the present invention.

FIG. 2 illustrates a balun according to yet another embodiment of the present invention. Balun 200 includes two interleaved inductors 208 and 210 in metal layer 208' and vertically displaced spiral inductor 214 in metal layers 214' and 214", all of them above substrate 216. A first portion of inductor 214 is in layer 214' and a second portion of inductor 214 is in layer 214". Having an inductor which has twice the number of windings of inductor 114 split among two layers results in an inductor with a larger inductance, which can be desirable in some instances because it results in larger magnetic coupling.

Figure 3A:
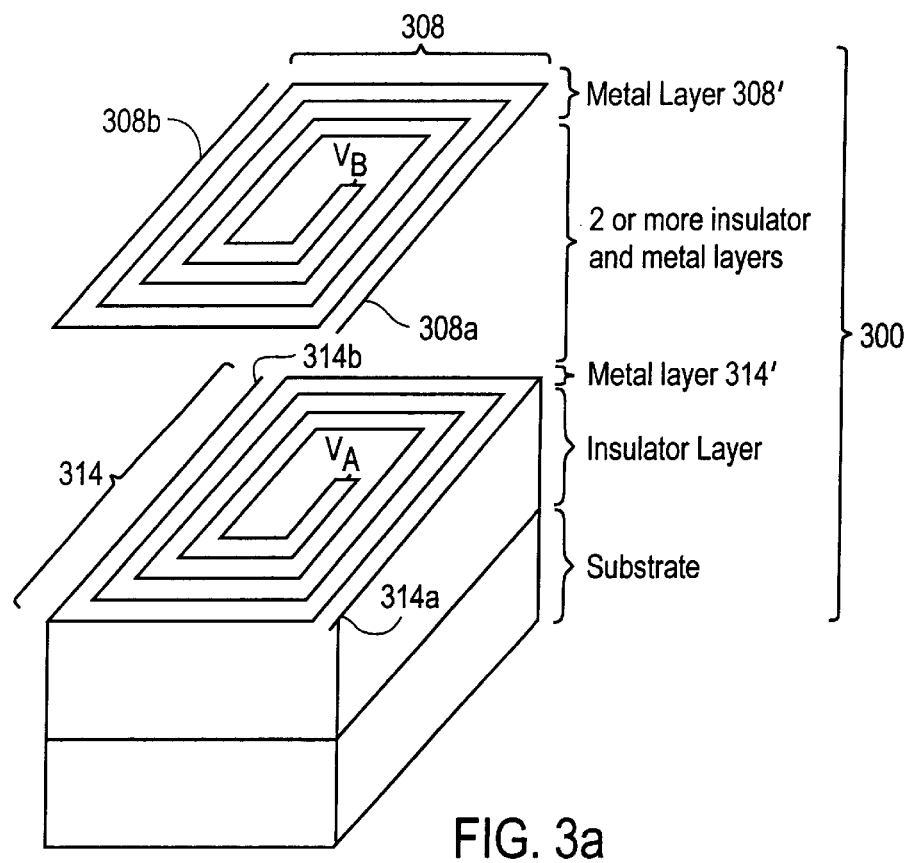
FIG. 3a illustrates a balanced transformer according to one embodiment of the present invention.
Figure 3B:
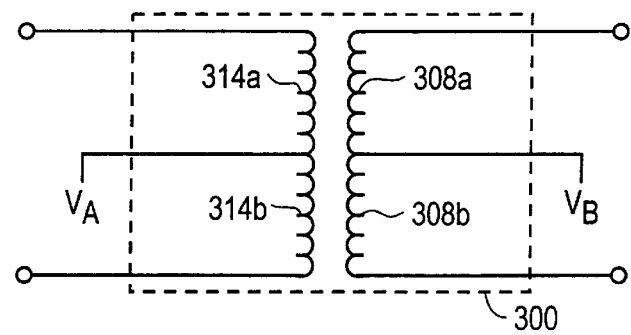
FIG. 3b illustrates an electrical circuit representation of transformer 300.
Figure 3C:
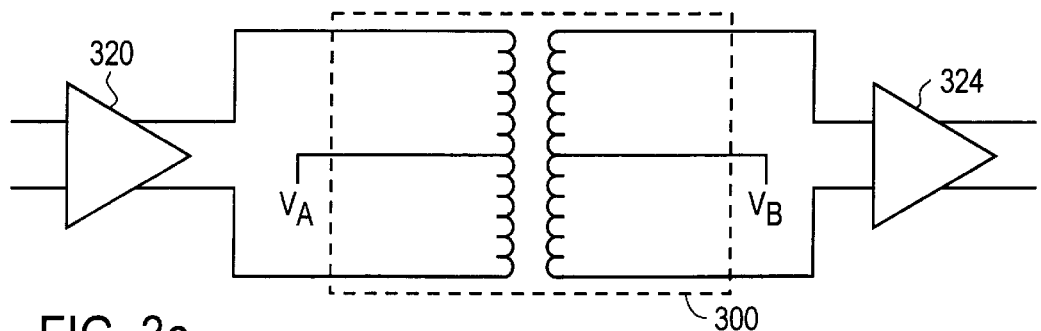
FIG. 3c illustrates two amplifiers coupled by a balanced line transformer.

FIG. 3a illustrates a transformer according to one embodiment of the present invention. Transformer 300 includes stacked interleaved inductors 308 and 314 in metal layers 308' and 314' respectively. Interleaved inductor 308 includes spiral inductors 308a and 308b. Interleaved inductor 314 includes spiral inductors 314a and 314b. The stacked interleaved structure provides good magnetic coupling between inductors 308 and 314 and symmetric parasitic characteristics between 308a and 308b, as well as between 314a and 314b. FIG. 3b illustrates an electrical circuit representation of transformer 300. A transformer such as transformer 300 is desirable because it can be used, for example, to match impedances between amplifier stages while providing DC (direct current) isolation between the stages. FIG. 3c illustrates two amplifiers coupled by a balanced line transformer. Because of the DC isolation between amplifier 320 and amplifier 324, amplifer 320's output can be set to a bias voltage $V_A$ and amplifier 324's input can be set to a different bias voltage $V_B$.

FIG. 4a illustrates another balun according to one embodiment of the present invention, which has the capability to transform a differential signal to a single ended signal and vice-versa. Transformer 400 includes inductors 408, 410 and 414. As shown in FIG. 4b1, the inductors 408 and 410 are interleaved to provide good magnetic coupling between them. According to one embodiment, they are disposed in the same layer except at areas 420a-1, and 420a-2 were one inductor crosses over the other. In one embodiment illustrated in FIG. 4b2, inductor 408 is entirely disposed on metal layer 408', with inductor 410 crossing inductor 408 using vias 422 that electrically connect to another metal layer 410' above or below the metal layer 408.' In the embodiment shown in FIG. 4b2, inductor 408 makes two right angle turns at the cross over area 420a-1, and although not shown in FIG. 4b2, inductor 410 also makes two right angle turns at the cross over area 420a-2. In the embodiment shown in FIG. 4b3, inductor 410 crosses over inductor 408 at an angle, such as, for example, 45 degrees or some other angle. Further, as shown in FIG. 4c inductor 414 is stacked on a different metal layer 414', disposed adjacent to one of layers 408' and 410', and allows inductor 414 to couple to each of inductors 408 and 410.

In a modified embodiment, inductors 408 and 410 can be disposed in separate metal layers 408' and 410', respectively. In the embodiment, since the inductors are on separate layers, a cross over is not required, although turns within a layer can be made within a layer to equalize coupling between inductors 408 and 410.

Thus, methods and apparatus for integrated baluns and transformers have been described. Although the present invention has been described with reference to specific exemplary embodiments, it will be evident to one of ordinary skill in the art that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A method for producing an on-chip signal transforming device, the method comprising:

providing a substrate;

laying a first conductive layer above the substrate, wherein the first conductive layer has formed thereon a first plurality of inductors disposed in interleaved manner; and laying a second conductive layer above the substrate and insulated from the first conductive layer, wherein the second conductive layer has formed thereon at least one inductor DC isolated from the first plurality of interleaved inductors.

2. The method of claim 1, wherein the second conductive layer is below the first conductive layer.

3. The method of claim 1, wherein the at least one inductor is a plurality of interleaved inductors.

4. The method of claim 1, wherein the at least one inductor is a spiral inductor.

5. The method of claim 1, further comprising laying a third conductive layer insulated from the first and second conductive layers and wherein the at least one inductor is partly in the third conductive layer and the first conductive layer is in between the second conductive layer and the third conductive layer.

6. A method for producing an on-chip signal transforming device, the method comprising:

providing a substrate;

laying a first conductive layer above the substrate, wherein the first conductive layer has formed thereon a first plurality of inductors disposed in interleaved manner; and laying a second conductive layer above the substrate insulated from the first conductive layer, wherein the second conductive layer has formed thereon a second plurality of interleaved inductors DC isolated from the first plurality of interleaved inductors.

7. A method for producing an on-chip signal transforming device, the method comprising:

providing a substrate;

laying a first conductive layer above the substrate, wherein the first conductive layer has formed thereon a first plurality of inductors disposed in interleaved manner; and laying a second conductive layer above the substrate insulated from the first conductive layer, wherein the second conductive layer has formed thereon a first part of an inductor DC isolated from the first plurality of interleaved inductors;

laying a third conductive layer insulated from the first and second conductive layers; and wherein the inductor has a second part in the third conductive layer, the first part and the second part are connected by way of a via and the first conductive layer is disposed between the second conductive layer and the third conductive layer.

8. A method for producing an on-chip signal transforming device, the method comprising:

providing a substrate;

laying a first conductive layer above the substrate, wherein the first conductive layer has formed thereon a first spiral inductor and a second spiral inductor; and laying a second conductive layer above the substrate insulated from the first conductive layer, wherein the second conductive layer has formed thereon at least a portion of the second spiral inductor, such that the first and second spiral inductors are interleaved, the portion of the second spiral inductor formed on the second conductive layer crossing the first spiral inductor.

9. The method according to claim 8 further including the step of:

laying a third spiral inductor on a third conductive layer above the substrate and insulated from the first and second conductive layers, wherein the third conductive layer has at least a third spiral inductor that couples magnetically to the first spiral inductor and the second spiral inductor.

10. A method for producing an on-chip signal transforming device, the method comprising:

providing a substrate;

laying a first conductive layer above the substrate, wherein the first conductive layer has a first spiral inductor and a second spiral inductor that are disposed in interleaved manner; and laying a second conductive layer above the substrate insulated from the first conductive layer;

providing a conductive path from the first conductive layer to the second conductive layer and back to the first conductive layer to allow the first spiral inductor to cross over the second spiral inductor.

11. The method according to claim 10 further including the step of:

laying a third spiral inductor on a third conductive layer above the substrate and insulated from the first and second conductive layers, wherein the third conductive layer has at least a third spiral inductor that couples to the first spiral inductor and the second spiral inductor.

* * * * *